(12) United States Patent
Vashchenko et al.

(10) Patent No.: US 7,298,599 B1
(45) Date of Patent: Nov. 20, 2007

(54) MULTISTAGE SNAPBACK ESD PROTECTION NETWORK

(75) Inventors: Vladislav Vashchenko, Palo Alto, CA (US); Peter J. Hopper, San Jose, CA (US); Yuri Mirgorodski, Sunnyvale, CA (US); Philip Lindorpher, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 479 days.

(21) Appl. No.: 10/917,605

(22) Filed: Aug. 13, 2004

(51) Int. Cl.
*H02H 9/00* (2006.01)
(52) U.S. Cl. .................................................. 361/56
(58) Field of Classification Search .................. 361/56
See application file for complete search history.

(56) References Cited

U.S. PATENT DOCUMENTS

| | | | | |
|---|---|---|---|---|
| 5,574,618 | A | * | 11/1996 | Croft .......................... 361/212 |
| 5,880,488 | A | * | 3/1999 | Yu .............................. 257/111 |
| 6,534,834 | B1 | * | 3/2003 | Ashton et al. ............... 257/355 |
| 6,621,126 | B2 | * | 9/2003 | Russ ........................... 257/355 |
| 6,803,633 | B2 | * | 10/2004 | Mergens et al. ............. 257/358 |
| 6,949,800 | B2 | * | 9/2005 | Steinhoff .................... 257/355 |
| 7,064,393 | B2 | * | 6/2006 | Mergens et al. ............ 257/360 |
| 2004/0021998 | A1 | * | 2/2004 | Salome et al. ............... 361/56 |

OTHER PUBLICATIONS

Russ, C., Gieser, J., Verhaege, K.; "ESD Protection Elements During HBM Stress Tests—Further Numerical and Experimental Results," EOS/ESD Symposium, 1994, pp. 96-105, no month.

Verhaege, K., Roussel, P. J., Groesenken, G., Maes, H.E., Gieser, H., Russ, C., Egger, P., Guggenmos, X., Kuper, F. G.; "Analysis of HBM ESD Testers and Specification Using a $4^{th}$ Order Lumped Element Model," EOS/ESD Symposium, 1993, pp. 129-131, no month.

Verhaege, K., Groeseneken, G., Maes, H. E.; "Influence of Tester, Test Method and Device Type on CDM ESD Testing"; EOS/ESD Symposium, 1994, pp. 49-62, no month.

Concannon, A., Vashchenko, V. A., Hopper, P., Beek, M. T., "ESD Protection of Double-Diffusion Devices in Submicron CMOS Processes", Proc. ESSDERC, 2004, pp. 261-264, no month.

* cited by examiner

*Primary Examiner*—Ronald W. Leja
(74) *Attorney, Agent, or Firm*—Girard & Equitz LLP

(57) ABSTRACT

A snapback ESD protection network coupled across first and second integrated circuit pads and including first and second snapback devices, such as SCR devices, with the second device having a turnoff current $I_{TOFF}$ which is greater than the turnoff current of the first device. Each of the snapback devices has an anode terminal and a cathode terminal, with the first device anode and cathode terminals being coupled to the respective first and second integrated circuit pads through a first effective series resistance and the second device being coupled to the respective first and second integrated circuit pads through a second effective series resistance, with the first effective series resistance being smaller than the second so as to cause the first and second snapback devices to tend to turn on at about the same time at the beginning of an ESD event. The differences in turnoff current cause the second snapback device to turn off prior to the first snapback device at the conclusion of an ESD event.

31 Claims, 3 Drawing Sheets

MULTISTAGE SNAPBACK ESD PROTECTION NETWORK

BACKGROUND OF THE INVENTION

1. Field of the Invention

The present invention relates generally to apparatus for protecting circuits from Electro Static Discharge (ESD) and, in particular, a network of snapback stages having controlled turnoff characteristics.

2. Description of Related Art

An integrated circuit may be subjected to an ESD event that can damage or destroy circuitry of the integrated circuit. Various types of ESD clamps have been devised which are typically connected in parallel to the circuitry to be protected and operate to shunt current around the circuitry to be protected during an ESD event. In order to provide effective protection while not interfering with the normal operation of the integrated circuit, the design of the ESD clamp must, among other things, take into account the breakdown voltage of the circuit to be protected and the normal operating voltage of the circuit. Normal operating voltages should not be sufficient to trigger the ESD clamp. Further, after the occurrence of an ESD event, the protection circuit should disengage, that is, unlatch, once normal operating voltages return.

FIG. 1 shows a conventional ESD protection or clamp circuit 10 connected to as to protect a exemplary circuit 14. Circuit 14 has, in the FIG. 1 example, an input connected to one integrated circuit pad 12A and a circuit common connected to another pad 12B. An ESD simulation circuit 16 is shown in accordance with the well-known Human Body Model (HBM) standard for simulating an ESD event produced by a human having a static charge. The HBM circuit includes a capacitor 18 of 100 picoFarads which is charged to approximately 5 kVolts. The charge on the capacitor 18 is transferred through a resistance 20 of 1.5 kΩ when the terminals 16A and 16B of the simulation circuit are applied to the pads 12A and 12B of the integrated circuit containing the circuit 14 to be protected. Assuming that the ESD protection circuit 10 is not present, the high voltage on the capacitor 18 will be applied directly to the input of the circuit 14. This high voltage will cause the input of circuit 14 to break down thereby causing current to flow though the circuit. If this current is limited to a short duration, circuit 14 will usually not be permanently damaged. However, unless steps are taken, the current will flow for a sufficient duration and magnitude to cause over heating of circuit 14 and permanent damage.

Referring to FIG. 2, a curve 22 is depicted that represents the voltage-current (V-I) characteristics of a typical ESD protection circuit 10, sometimes referred to as a snapback clamp. The primary objective of the ESD clamp circuit is to rapidly respond to an ESD event by shunting the large current (typically a few amperes) away from the circuit 14 to be protected so that any voltages generated in the circuit to be protected do not result in current flow through the circuit of sufficient magnitude to damage the circuit. Further, the ESD clamp circuit must not be triggered during normal operation and should unclamp at the end of the event so that normal operation can resume, as previously noted.

An ESD event will cause the voltage across the clamp circuit 10 and protected circuit 14 to rapidly increase. The ESD event is capable of producing a current having a magnitude of $I_{ESD}$, which can be as large as a few amperes. As the voltage across the ESD clamp 10 and the circuit 14 to be protected increases, the clamp will start to turn on significantly, that is trigger, at point 22A of curve 22. Clamp 10 is implemented so that the trigger point is below the breakdown voltage of circuit 14, although very short duration voltage peaks in excess of the circuit breakdown do not result in damage. The ESD clamp will then enter a negative resistance or snapback area of operation and will continue conducting an increasing current until the voltage across the clamp has been reduced to a holding voltage indicated by point 22B. The clamp current will ideally continue to increase until the current reaches the maximum current $I_{ESD}$ at point 22C. If the maximum $I_{ESD}$ current is too large for the clamp, the clamp will eventually reach a breakdown voltage at point 22D, with any additional current causing the clamp to be damaged or destroyed. Once the ESD event has ended, the ESD protection circuit 10 should unlatch thereby permitting normal operation of circuit 14.

Although there are a wide variety of circuits that can be used as ESD clamps, silicon controlled rectifiers (SCR) are frequently used for this application. FIGS. 3A and 3B depict one conventional implementation of an SCR type clamp circuit 10 commonly used in ESD applications. The FIG. 3A, 3B structure is sometimes called a low voltage triggered silicon controlled rectifier (LVTSCR). The exemplary LVTSCR if formed in a P type substrate 24. An N well 26 is formed in the substrate 24, with an N+ region 28 forming a contact to the N well. A P+ region 30 also formed in the N well 26, separated from the N+ region by a shallow trench isolation (sti) region 32A. An N+ extension 26A is formed near one end of the N well 26 and is separated from P+ region 30 by a further shallow trench isolation region 32B. N+ and P+ regions 28 and 30 are electrically interconnected by a metal track 34 (not shown in FIG. 3B), with this connection forming the anode terminal of the LTVSCR. As can best be seen in FIG. 3B, metal track 28 is electrically connected to N+ region 28 and P+ region 30 by way of a plurality of respective contact openings 26A and 30A formed in the oxide layer (not designated) disposed over those regions.

A further N+ region 36 is formed in the P substrate 24 and spaced apart from the extension 26A so as to form a channel region 24A intermediate the N+ regions 36 and 26A. A polysilicon gate 38 is disposed over the channel region 24A and is separated from the channel regions by a thin gate oxide (not designated). A P+ region 40 is formed in the P substrate 24 and separated from region 36 by a shallow trench isolation region 32C, with P+ region 40 forming a contact to the P substrate 24. P+ region 40 and N+ region 36 are connected together by a metal track 42 (not shown in FIG. 3B) which forms the cathode of the LVTSCR 10. Again as can best be seen in FIG. 3B, the metal track is electrically connected to N+ region 36 and P+ region 40 by way of a plurality of respective contact openings 36A and 40A formed in the oxide layer (not designated) disposed over those regions.

LVTSCR 10, as is the case for all SCR type structures, can be viewed as a PNP transistor merged with an NPN transistor, with the base of the PNP transistor and the collector of the PNP transistor being common and the collector of the PNP and the base of the NPN being common. P+ region 30, N well 26 and P substrate 24 forming the respective emitter, base and collector regions of the PNP device. The N well region 26 further defines a resistor having one terminal which is part of the base on the PNP and a second terminal which is connected to the emitter by way of N+ region 28 and metal track 34. The NPN device includes the N+ region 36, the P substrate 24 and the N well 26 which form the emitter, base and collector of the device. A resistor is formed in the P substrate 24, having one terminal that is part of the NPN base region and a second terminal connected to the emitter by way of P+ region 40 and metal track 42.

In operation, at the beginning of and ESD event, when the voltage is low, the PN junction between N well 26 and the P substrate 24 is slightly reversed biased. This reversed biased PN junction forms the common base-collector junction of the NPN and PNP devices. As the voltage increases, the leakage current increases when the PN junction begins avalanching. The junction voltage at which avalanching occurs is reduced by the highly doped N+ region 26A. The leakage current flows through the N well 26 resistor disposed between the base and emitter of the PNP thereby tending to turn on the PNP device. The current is enhanced by the nMOS transistor formed by drain region 26A, sometimes referred to as a floating drain, and source region 36. This nMOS transistor, which is effectively connected in parallel with the NPN transistor, will produce an added current though the N well resistor 26 thereby adding to the current that turns on the PNP transistor. The gate 38 is sometime referred to as the trigger input of the LVTSCR device. The turn on voltage or trigger voltage is represented by point 22A of FIG. 2.

Eventually, the increase in current in the PNP and NPN transistors will increase the current gain of the two devices so that each device will cause the other device to turn on. This regenerative SCR action will continue thereby reducing the voltage across the LVTSCR until the voltage drops to a holding voltage represented by point 22B of FIG. 2. As additional ESD current is conducted, the voltage across the LVTSCR will increase until the total $I_{ESD}$ current is shunted through the device, as shown by point 22C of FIG. 2. Ideally, the device 10 has sufficient current conduction capability so that the voltage never reaches the thermal breakdown voltage of the represented by point 22D.

The threshold voltage of the LVTSCR can be adjusted by various means, including controlling the gate-source voltage of the nMOS transistor. Gate 32 could by grounded thereby producing a relatively high threshold voltage. A resistive divider can also be used to bias the gate voltage. Further, an RC network can be used, with a capacitor of suitable size connected between the gate 38 and anode 34 and a resistor of suitable size being connected between the gate 38 and the cathode 42. The RC circuit can also be formed by the parasitic capacitance of device 10 between the gate and anode so that only a gate to cathode resistor need by added to the device.

Although prior art ESD protection circuits, such as the LVTSCR 10 of FIGS. 3A and 3B, provide adequate circuit protection in many applications, it has been found that such circuits fail to adequately protect circuits 14 under various operating conditions. There is a need for ESD protection approaches that provide more adequate protection.

DETAILED DESCRIPTION OF THE INVENTION

Figure 1:
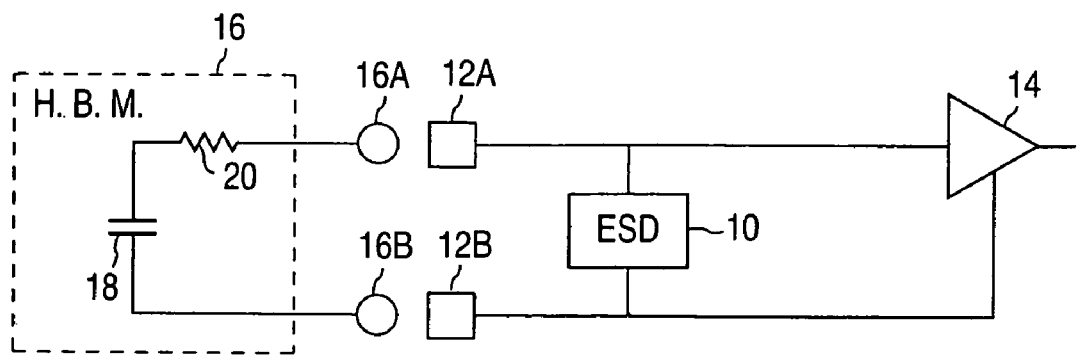
FIG. 1 shows a conventional ESD protection circuit connected to protect a circuit from an ESD event produced by an ESD event simulator circuit.
Figure 4:
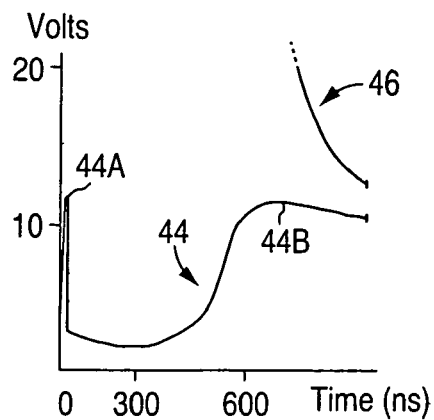
FIG. 4 depicts waveforms representing the voltage across a prior art LVTSCR device and the voltage across the Human Body Model capacitor at the beginning and end of a simulated ESD event.

Referring again to the drawings, FIG. 4 depicts the time response characteristics of the circuitry of FIG. 1 just after the occurrence of a simulated ESD event. Waveform 44 represents the voltage between pads 12A and 12B over time, with waveform 46 representing the voltage across capacitor 18 at a some time after the event has occurred. Initially, the large ESD voltage will exceed the trigger voltage of LVTSCR or protection circuit 10, with the trigger voltage being represented by point 22A of FIG. 2. Thus, the protection circuit 10 will be triggered. The finite response time of the protection circuit permits a voltage at point 44A of FIG. 4 to be momentarily produced between pads 12A and 12B that may exceed, to some extent, the breakdown voltage of the circuit 14 to be protected. This voltage is of sufficiently short duration so that the circuit 14 is not damaged by such breakdown.

Figure 2:
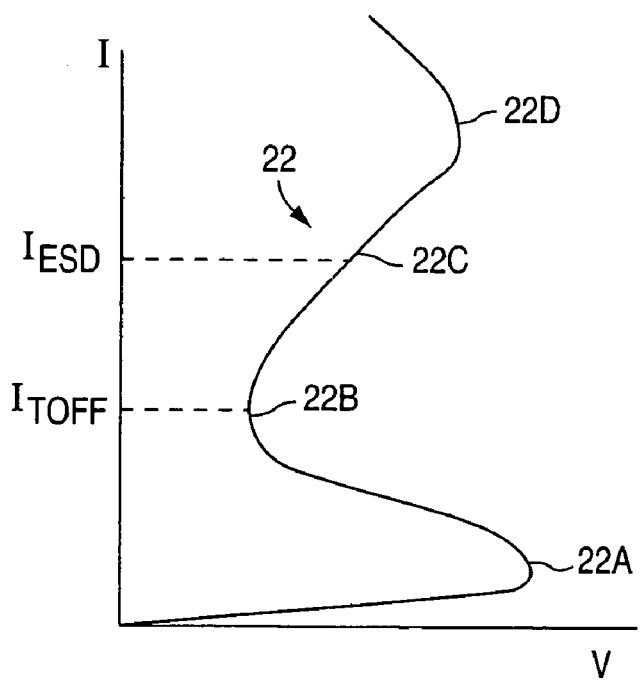
FIG. 2 is a graph illustrating the voltage-current characteristics of a typical prior art ESD protection circuit.

Once the protection circuit 10 has turned on, the circuit will clamp thereby reducing the voltage to the holding voltage at point 22B of FIG. 2. This is shown in FIG. 4 at the 300 nanosecond range. At this point, the ESD protection circuit 10 is conducting large ESD currents in the ampere range while limiting the voltage in the range indicated between points 22B and 22C of FIG. 2. Eventually, at times determined by the RC time constant of resistor 20 and capacitor 18 of the HBM circuit 16 of FIG. 1, the current through the protection circuit will begin to drop so that the voltage across the circuit will begin to increase as indicated by that portion of curve 22 (FIG. 2) between points 22D and 22B. Eventually, the current through the protection circuit 10 will drop below the turn off current $I_{TOFF}$ of the protection circuit 10 so that the circuit will begin to turn completely off. This will cause the voltage across the protection circuit 10 to increase as indicated by curve 44 in the 300 to 600 nanosecond time period. At this point in time, a significant charge remains on capacitor 18 as indicated by curve 46 of FIG. 4. Thus, the voltage across the off, or partially off, protection circuit 10 will be permitted to increase, with the actual voltage depending upon the remaining charge on capacitor 18. That remaining charge is a function, among other things, of the RC time constant of resistor 20 and capacitor 18 of the HBM circuit 16 of FIG. 1.

Figure 3A:
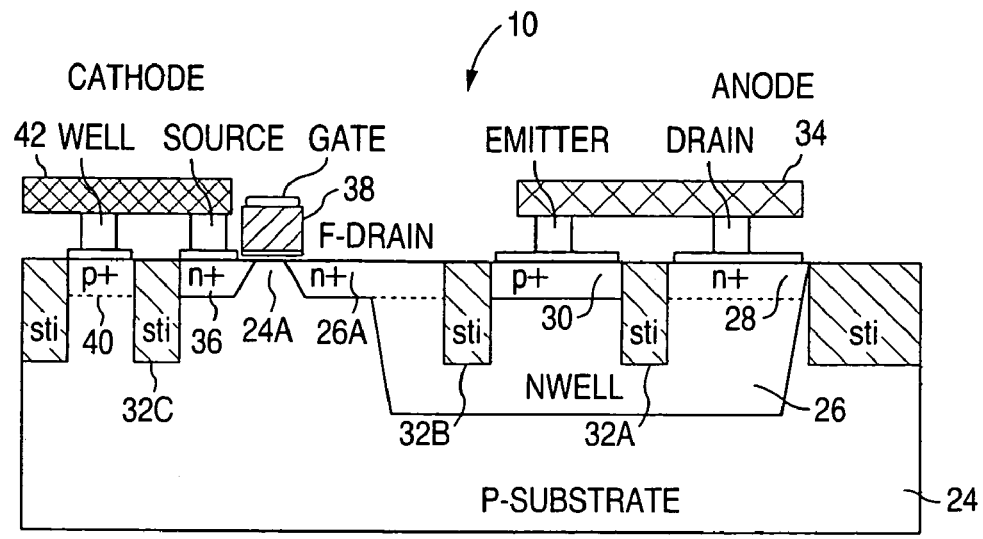
FIGS. 3A and 3B are respective simplified side elevational and plan views of a prior art LVTSCR device commonly used for ESD protection.
Figure 3B:
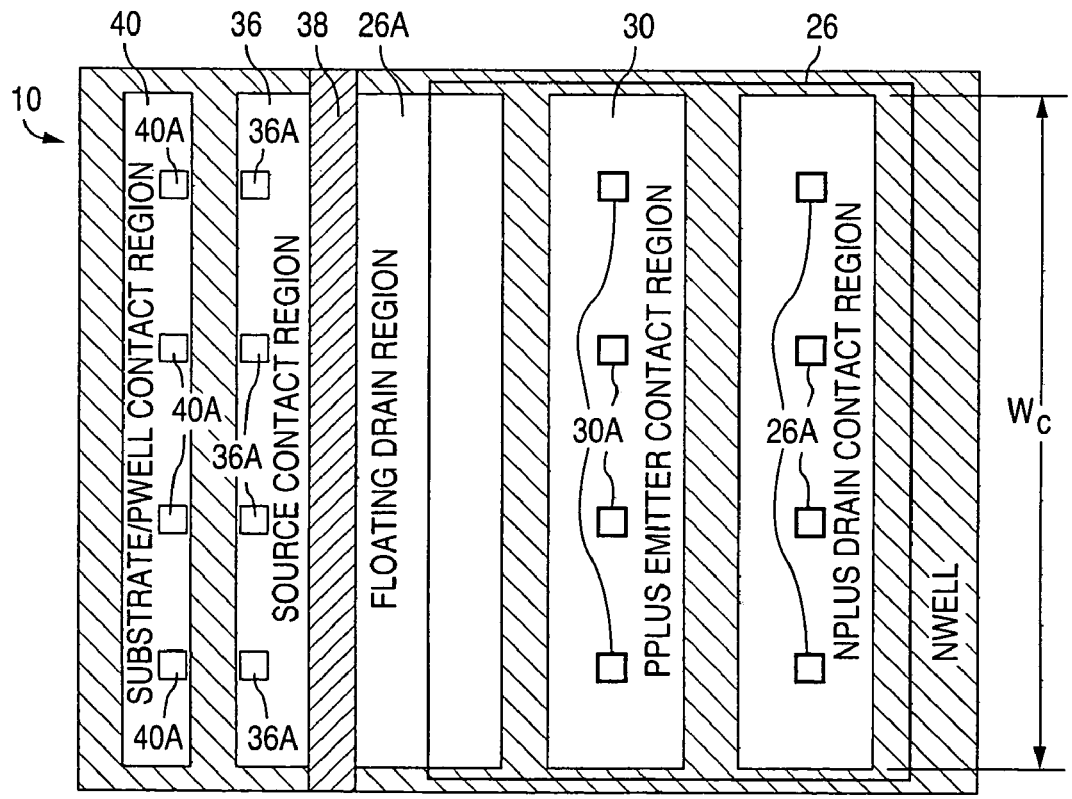

It would be possible to reduce the turn off current $I_{TOFF}$ off the protection device 10 by reducing the size of the device. For example, as shown in FIG. 3B, LVTSCR protection device 10 has a contact region width of $W_C$, with width $W_C$ being proportional to the value of the current values of the device shown in FIG. 2. Thus, for example, the turn off current $I_{TOFF}$ can be reduced by a factor of two by reducing the value of $W_C$ by the same factor of two. This will reduce and therefore delay the turnoff time of device 10 so that the residual voltage at turnoff will be at a sufficiently small value so as not to damage circuit 14. However, the reduced size protection device 10 will also have a corresponding reduced maximum ESD event current $I_{ESD}$ conducting capability. Thus, adequate ESD protection will not be provided.

Figure 5:
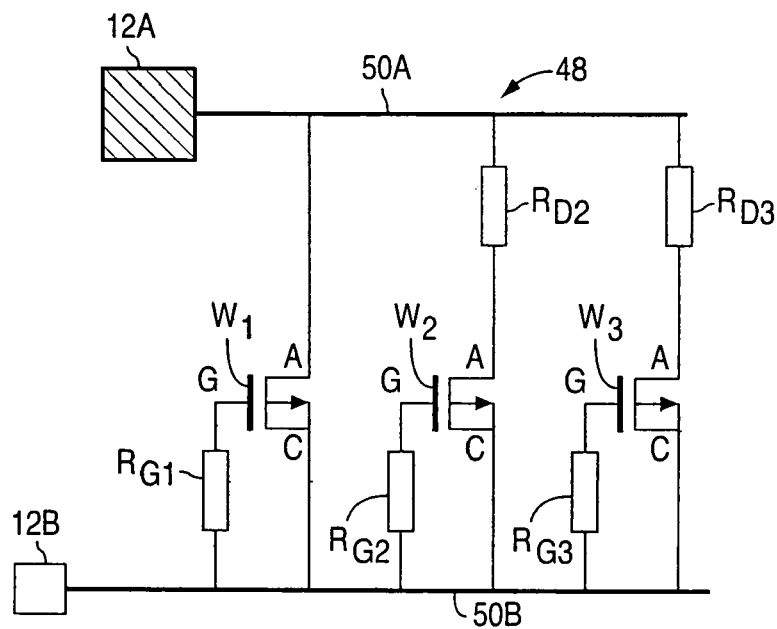
FIG. 5 is a diagram of one embodiment of the ESD protection network that includes three separate LVTSCR devices.

The approach in accordance with the present invention is to provide adequate protection with respect to the maximum ESD event current $I_{ESD}$ while avoiding the above described turn off problem. Referring to FIG. 5, an exemplary multi-stage snapback ESD protection network 48 in accordance with one embodiment of the present invention is disclosed. In this exemplary embodiment, the network 48 includes three separate stages W1, W2 and W3 of snapback circuits, with each stage including one snapback ESD protection such as the LVTSCR device 10 as shown in FIGS. 3A and 3B. Depending upon the application, the number of stages can be reduced to two and increased to more than three. The network is implemented such that all three stages W1, W2 and W3 are triggered to a conductive state at the beginning of an ESD event, with the stages having a total current conduction capability to accommodate the maximum ESD event current $I_{ESD}$. Further, the stages are implemented so that, near the end of the ESD event, the stages turn off sequentially with one of the stages remaining conductive sufficiently long such that the residual voltage present on the HBM capacitor 18 is not large enough to damage the protected circuit 14. In addition, the stages are implemented such that, during the controlled turn off sequence, the stage or stages remaining on have sufficient current carrying capacity so that they are not damaged by overheating.

The exemplary stages W1, W2 and W3 are each implemented using snapback devices, such as the LVTSCR device 10 shown in FIGS. 3A and 3B. In order to facilitate a controlled turnoff sequence, the LVTSCR devices of stages W1, W2 and W3 are preferably substantially identical other than having differing contact region widths $W_C$. Assuming, for example, that a single LVTSCR device having a width $W_C$ of 100 microns would be sufficient to handle an anticipated maximum $I_{ESD}$ current for a particular application, the total width of devices W1, W2 and W3 is selected to be 100 microns. W1 is the smallest device of the network and has a width WC of 1 micron. Small device W1 will be the last device to turn off in the turn off sequence and has a relatively low turn off current $I_{TOFF}$. This will ensure that the HBM capacitor 18 is discharged to a sufficiently low voltage when the last LVTSCR device W1 is turned off so that the circuit 14 to be protected will not be damaged. Intermediate size device W2, the second device to be turned off in the turnoff sequence, has a width $W_C$ of 5 microns and large device W3, the first device to be turned off, has a width $W_C$ of 94 microns. The width of W2 is selected, such that, when W2 and W1 are the remaining conductive devices in the turn off sequence, both devices together have adequate current handling capability. Typically, the ratio of the contact region width $W_C$ of the largest device in the network to the smallest device in the network is at least ten to one. Thus, the ratio of turnoff current $I_{TOFF}$ of the largest device to the turnoff current $I_{TOFF}$ of the smallest device is typically at least ten to one.

In order to ensure that all three devices W1, W2 and W3 turn on during an ESD event, the total effective resistance in series with the devices as measured from the integrated circuit pads 12A and 12B connected to the device 14 to be protected is controlled. The smallest device W1 should be positioned closest to the pads 12A and 12B to establish a relatively low resistance path between pads 12A and 12B as defined by the resistance of the relevant portion of pad connection line 50A, the connection (not designated) between line 50A and the anode A of device W1, the connection between the cathode C of device W1 and line 50B and the relevant portion of pad connection line 50B extending to pad 12B. Assuming idealized zero resistance elements, the total effective resistance associated with device W1, resistance RD1 (not depicted) is 0Ω. Intermediate device W2 can be positioned further away from the pads 12A and 12B, with resistance element RD2 representing the total effective series resistance from pad 12A to the anode A of device W2 and the resistance from the cathode C of device W2 to pad 12B. Similarly, the largest device W3 has a total effective series resistance represented by resistance element RD3. The values of the effective resistances are selected such RD3>RD2>RD1. This relationship could also be achieved, by way of further example, by connecting the anode A of W3 through a resistance element to the anode of W2 so that the effective series resistance associated with device W3 includes the sum of the resistance element and RD2. As previously noted, effective ideal series resistance RD1 is typically 0Ω, with RD2 being 0.1Ω and RD3 being 1.0Ω. In that the actual value of RD1 will be non-zero, the values of RD2 and RD3 are increased accordingly to maintain the desired relative magnitudes.

Each device W1, W2 and W3 of the network further includes a passive RC gate driver circuit connected to the gate or control electrode G. The driver circuit for device W1 includes a resistor RG1 connected between the gate electrode G and the cathode C. The parasitic capacitance between the anode A and the gate electrode form the capacitive component of the RC network of device W1. The driver circuits for devices W2 and W3 include respective resistances RG2 and RG3 that form respective RC networks for those devices. Since the value of the parasitic capacitances of W1, W2 and W3 is proportional to the contact region width $W_C$, the values of RG1, RG2 and RG3 are adjusted to provide the same RC time constant for each device so that the devices tend to turn on at the same time. Thus, RG1 can be about 10 kΩ, with RG2 and RG3 being about 50 kΩ and 200 kΩ, respectively.

Figure 6:
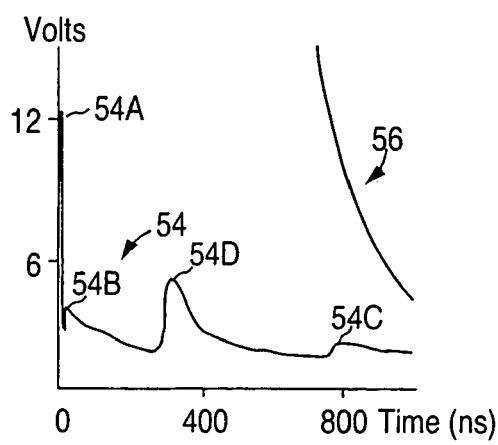
FIG. 6 depicts waveforms representing the voltage across the FIG. 5 network and the voltage across the Human Body Model capacitor at the beginning and end of a simulated ESD event.

FIG. 6 shows a waveform 54 representing the voltage across network 48 of FIG. 5 during an ESD event. At the beginning of the event, the small LVTSCR device W1 is initially turned on, with resistances RD2 and RD3 functioning to keep larger devices W2 and W3 momentarily off until this occurs. Once device W1 is conducting, device W2 turns on, with resistor RD3 functioning to keep W3 off until this occurs. Finally, W3, the largest device turns on, conducting the majority of the ESD current at this point. This turn on sequence occurs rapidly, with the voltage across the network 48 being limited to about 12 volts as indicated by point 54A of the waveform 54. This voltage may be sufficiently large to breakdown the input to the circuit 14 to be protected, but the duration is so short that no permanent damage occurs.

At about point 54B of curve 54, the ESD current flow through the network has decrease to a point at which the current is at the critical turnoff current $I_{TOFF}$ of large device W3 but not smaller devices W2 and W1. Thus, at point 54B, the larger device W3 turns off. The point at which W3 turns off results in a small voltage spike across the network 48 which will not damage the circuitry being protected. At this point, the majority of the ESD current will be conducted by intermediate size device W2, which must be of sufficient size to safely handle the reduced ESD current at this point.

As the network continues by pass the ESD current, the current drops to a value near the critical turnoff current $I_{TOFF}$ of device W2 but still greater than the turnoff current for device W1. Thus, device W2 will turn off, thereby resulting in the small voltage spike at point 54D. The small device W1 will continue to conduct the remaining ESD current until that current reaches the critical turnoff current $I_{TOFF}$ of device W1. At this point, the charge on the HBM capacitor 18, as indicated by curve 56 of FIG. 6, has been reduced to a level sufficiently low such that the voltage across the network 48 increases only a small amount when all of the LVTSCR devices of the network are off. This is shown at point 54C of curve 54. Thus, the damage to the circuit to be protected, as previously described in connection with FIG. 4, is avoided. Typically, the smallest snapback device of the network should turn off at least 100 nanoseconds after the largest snapback device has turned off, although the turn off time difference will typically be significantly greater.

Thus, an exemplary multistage snapback ESD protection circuit has been disclosed. Although one exemplary embodiment has been described in detail, various changes could be made by those skilled in the art without departing from the spirit and scope of the invention as defined by the appended claims. For example, depending upon the application, the number of snapback stages can be decreased to two or increased to values greater than three. Further, snapback devices other than LVTSCR circuits can be used.

The invention claimed is:

1. A snapback ESD protection network coupled across first and second integrated circuit pads, said network comprising:
   a first snapback device including an anode terminal and a cathode terminal;
   a second snapback device including an anode terminal and a cathode terminal, with said second snapback device having a turnoff current that is at least ten times greater than a turnoff current of the first snapback device;
   a first connection circuit for electrically connecting the anode of the first snapback device to the first integrated circuit pad and electrically connecting the cathode of the first snapback device to the second integrated circuit pad, with the first connection circuit creating a first effective series resistance between the first and second integrated circuit pads and the first snapback device; and
   a second connection circuit for electrically connecting the anode terminal of the second snapback device to the first integrated circuit pad and electrically connecting the cathode terminal of the second snapback device to the second integrated circuit pad, with the second connection circuit creating a second effective series resistance between the first and second integrated circuit pads and the second snapback device greater than the first effective series resistance.

2. The protection network of claim 1 further including a third snapback device including an anode terminal and a cathode terminal, with said third snapback device having a turnoff current greater than the turnoff current of the first snapback device and less than the turnoff current of the second snapback device.

3. The protection network of claim 2 further including a third connection circuit for electrically connecting the anode of the third snapback device to the first integrated circuit pad and electrically connecting the cathode of the third snapback device to the second integrated circuit pad, with the third connection circuit creating a third effective series resistance between the first and second integrated circuit pads and the third snapback device, with third effective series resistance being greater than the first effective series resistance and with the second effective series resistance being greater than the third effective series resistance.

4. The protection network of claim 3 wherein, except for the anode and cathode terminals, the first and second snapback devices are electrically isolated from one another.

5. The protection network of claim 3 wherein the second effective series resistance is at least ten times greater than the third effective series resistance.

6. The protection network of claim 1 wherein the first and second connection circuits include common circuitry.

7. The protection network of claim 1 wherein the first and second snapback devices each include respective first and second SCR devices.

8. The protection network of claim 7 wherein the second SCR device has a contact region width $W_C$ at least ten times as great as a contact region width of the first SCR device.

9. The protection network of claim 8 further including a first driver circuit connected to a control terminal of the first SCR device and a second driver circuit, separate from the first driver circuit, connected to a control terminal of the second SCR device, with the control terminals being of a common polarity.

10. The protection network of claim 9 wherein the first driver circuit is a passive driver circuit which includes a first resistance and wherein the second driver circuit is a passive driver circuit which includes a second resistance, with the second resistance being at least ten times greater than the first resistance.

11. The protection network of claim 1 wherein the first and second snapback devices each include a separate common polarity control terminal and a separate driver circuit connected to the control terminal.

12. The protection network of claim 1 wherein each of the snapback devices includes a common polarity control terminal electrically isolated from one another.

13. The protection network of claim 12 further including separate driver circuits connected to the respective common polarity control terminals.

14. The protection network of claim 1 wherein the second effective series resistance is at least ten times greater than the first effective series resistance.

15. The protection network of claim 1 wherein, except for the anode and cathode terminals, the first and second snapback devices are electrically isolated from one another other.

16. A snapback ESD protection network coupled across first and second terminals, said network comprising:
   a first SCR device including an anode terminal coupled to the first terminal, a cathode terminal coupled to the second terminal and a control terminal;
   a first driver circuit connected to the control terminal of the first SCR device;
   a second SCR device including an anode terminal coupled to the first terminal, a cathode terminal coupled to the second terminal and a control terminal, with the respective control terminals of the first and second SCR devices being of a common polarity and with said second SCR device having a turnoff current $I_{TOFF}$ at least ten times greater than a turnoff current of the first SCR device; and
   a second driver circuit separate from the first driver circuit and electrically connected to the control terminal of the second SCR device.

17. The protection network of claim 16 further including a third SCR device having an anode terminal coupled to the first terminal, a cathode terminal coupled to the second terminal and a control terminal of the common polarity, with the third SCR device having a turnoff current intermediate the turnoff current of the first and second SCR devices.

18. The protection network of claim 17 further including a third driver circuit separate from the first and second driver circuits and connected to the control terminal of the third SCR device.

19. The protection network of claim 16 wherein the first and second SCR devices are LVTSCR devices.

20. The protection network of claim 16 wherein the second SCR has a contact region width $W_C$ at least ten times the contact region width of the first SCR device.

21. The protection network of claim 16 further including
a first connection circuit for electrically connecting the anode of the first SCR device to the first terminal and electrically connecting the cathode of the first SCR device to the second terminal, with the first connection circuit creating a first effective series resistance between the first and second terminals and the first SCR device; and
a second connection circuit for electrically connecting the anode terminal of the second SCR device to the first terminal and electrically connecting the cathode terminal of the second SCR device to the second terminal, with the second connection circuit creating a second effective series resistance between the first and second terminals and second SCR device greater than the first effective series resistance.

22. The protection network of claim 21 wherein the first and second connection circuits include common circuitry.

23. The protection network of claim 21 wherein the second effective series resistance is at least ten times greater than the first effective series resistance.

24. A snapback ESD protection network coupled across first and second terminals, said network comprising:
a first snapback device including an anode terminal coupled to the first terminal, a cathode terminal coupled to the second terminal and a control terminal;
a second snapback device including an anode terminal coupled to the first terminal, a cathode terminal coupled to the second terminal and a control terminal, with the control terminals of the first and second snapback devices being of a common polarity and electrically isolated from one another; and
turnoff control means for controlling turnoff of the first and second snapback devices after occurrence of an ESD event such that the first snapback device turns off after the second snapback device turns off.

25. The protection network of claim 24 wherein the first snapback device turns off at least 100 nanoseconds after the second snapback device turns off.

26. The protection network of claim 24 wherein the turnoff control means is at least partially implemented by setting a turnoff current $I_{TOFF}$ of the first snapback device to a value smaller than a turnoff current of the second snapback device.

27. The protection network of claim 24 wherein the first and second snapback devices are first and second respective SCR devices and wherein the turnoff control means is at least partially implemented by having a contact region width $W_C$ of the first SCR to be smaller than a contact region width of the second SCR.

28. The protection network of claim 24 further including
a first connection circuit for electrically connecting the anode of the first snapback device to the first terminal and electrically connecting the cathode of the first snapback device to the second terminal, with the first connection circuit creating a first effective series resistance between the first and second terminals and the first snapback device; and
a second connection circuit for electrically connecting the anode terminal of the second snapback device to the first terminal and electrically connecting the cathode terminal of the second snapback device to the second terminal, with the second connection circuit creating a second effective series resistance between the first and second terminals and second snapback device greater than the first effective series resistance.

29. The protection network of claim 24 further including a first driver circuit coupled to the control terminal of the first snapback device and a second driver circuit, separate from the first driver circuit, coupled to the control terminal of the second snapback device, with the control terminals being of a common polarity.

30. The protection network of claim 29 wherein the first driver circuit includes a first resistor connected to the control terminal of the first snapback device and the second driver circuit includes a second resistor connected to the control terminal of the second snapback device, with the second resistor having a resistance at least ten times a resistance of the first resistor.

31. The protection network of claim 24 wherein, except for the anode and cathode terminals, the first and second snapback devices are electrically isolated from one another.

* * * * *